United States Patent
Kim et al.

(10) Patent No.: US 8,583,982 B2
(45) Date of Patent: Nov. 12, 2013

(54) CONCATENATED DECODER AND CONCATENATED DECODING METHOD

(75) Inventors: Jaehong Kim, Seoul (KR); Jun Jin Kong, Yongin-si (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 1129 days.

(21) Appl. No.: 12/073,883

(22) Filed: Mar. 11, 2008

(65) Prior Publication Data

US 2009/0106637 A1    Apr. 23, 2009

(30) Foreign Application Priority Data

Oct. 23, 2007    (KR) .......................... 10-2007-0106816

(51) Int. Cl.
*G06F 11/00*    (2006.01)

(52) U.S. Cl.
USPC ............ 714/755; 714/754; 714/752; 714/760

(58) Field of Classification Search
USPC ......................... 714/755, 752, 754, 758, 760
See application file for complete search history.

(56) References Cited

U.S. PATENT DOCUMENTS

| | | | |
|---|---|---|---|
| 6,182,261 B1 | 1/2001 | Haller et al. | |
| 6,473,878 B1 | 10/2002 | Wei | |
| 6,678,857 B2 | 1/2004 | Sindhushayana et al. | |
| 6,812,873 B1 | 11/2004 | Siohan et al. | |
| 7,032,154 B2 * | 4/2006 | Kidorf et al. | 714/755 |
| 7,243,294 B1 | 7/2007 | Divsalar et al. | |
| 2004/0199847 A1 * | 10/2004 | Calabro et al. | 714/755 |
| 2008/0229170 A1 * | 9/2008 | Laprade et al. | 714/755 |

FOREIGN PATENT DOCUMENTS

| | | |
|---|---|---|
| JP | 2003-068024 | 3/2003 |
| KR | 10-2003-0061246 | 7/2003 |
| KR | 10-2005-0114162 | 12/2005 |

* cited by examiner

*Primary Examiner* — Sarai Butler
(74) *Attorney, Agent, or Firm* — Harness, Dickey & Pierce, P.L.C.

(57) ABSTRACT

A concatenated decoder and concatenated decoding method are provided. The concatenated decoder, including: an inner decoder to receive an input bit stream, inner-decode the received input bit stream, and generate a first bit stream; and an outer decoder to generate error information about the received first bit stream, according to the generated error information, transmit an iterative decoding continuation request to the inner decoder or outer-decode the first bit stream to generate a second bit stream.

14 Claims, 6 Drawing Sheets

CONCATENATED DECODER AND CONCATENATED DECODING METHOD

PRIORITY CLAIM

A claim of priority is made to Korean Patent Application No. 10-2007-0106816, filed on Oct. 23, 2007, in the Korean Intellectual Property Office, the disclosure of which is incorporated herein by reference.

BACKGROUND

1. Field

Example embodiments of the present invention may relate to error control codes, and more particularly, to a concatenated decoding method and concatenated decoder where a plurality of error control codes decoder is concatenated.

2. Description of Related Art

Generally, a path transmitting information is referred to as a channel. When information is transmitted via a wired communication, a channel is a transmission line where information is transmitted. When information is transmitted via a wireless communication, a channel is air where an electromagnetic wave including information passes.

A channel may be a process of storing information in a semiconductor memory device and reading stored information from the semiconductor memory device. Also, a channel may be a time passage from when a semiconductor memory device stores information to when stored information is read from the semiconductor memory device, and a channel may be a physical path to store information in a semiconductor memory device and read stored information from the semiconductor memory device.

Information may be corrupted while transmitting information via a channel. Corrupted information includes errors. Much research has been conducted to detect errors from corrupted information, remove detected errors, and restore initial information.

An error control code encoding refers to an operation of adding an additional parity to initial information prior to generating and transmitting a codeword. An error control code decoding refers to an operation of separating an additional parity from received codeword and restoring initial information.

An error rate occurring in a channel may be significant depending on a channel feature. Generally, as an error rate increases, hardware complexity for embodying an error control code encoding and error control code decoding to overcome such errors increases.

A channel with a great error rate may use a concatenated encoder where a plurality of error control code encoders is concatenated. A concatenated decoder is used to restore initial information from information generated by a concatenated encoder.

A concatenated decoder is generally designed in reverse order of a concatenated encoder. For example, when a concatenated encoder includes an encoder A and an encoder B in sequence, a concatenated decoder includes a decoder B and a decoder A in sequence.

A concatenated decoder and concatenated decoding method which improves an error correcting capability is provided in this specification.

SUMMARY

Example embodiments of present invention may provide a concatenated decoder and concatenated decoding method which may reduce a number of iteration required by the concatenated decoder for restoring initial information through iteration.

The example embodiments of present invention may also provide a concatenated decoder and concatenated decoding method which reduces a number of computations of the concatenated decoder, and thereby may reduce power consumption.

The example embodiments of present invention may also provide a concatenated decoder and concatenated decoding method which may improve an error correcting capability of the concatenated decoder.

The example embodiments of present invention may also provide a concatenated decoder and concatenated decoding method which feedbacks error information to an inner decoder from an outer decoder.

In an example embodiment of the present invention, a concatenated decoder may include an inner decoder to receive an input bit stream, and inner-decode the received input bit stream to generate a first bit stream, and an outer decoder to generate error information about the received first bit stream, according to the generated error information, transmit an iterative decoding continuation request to the inner decoder or outer-decode the first bit stream to generate a second bit stream.

In another example embodiment of the present invention, a concatenated decoding method may include inner-decoding a received input bit stream to generate a first bit stream, generating error information about the generated first bit stream in an outer decoder, transmitting an iterative decoding continuation request to an inner decoder, when the generated error information is greater than a maximum error correcting capability of an outer decoder, and outer-decoding the first bit stream to generate a second bit stream, when the generated error information is not greater than the maximum error correcting capability of the outer decoder.

BRIEF DESCRIPTION OF THE DRAWINGS

The above and other aspects of example embodiments of the present invention may become apparent and more readily appreciated from the following detailed description, taken in conjunction with the accompanying drawings of which.

DETAILED DESCRIPTION OF EXAMPLE EMBODIMENTS

Figure 1:
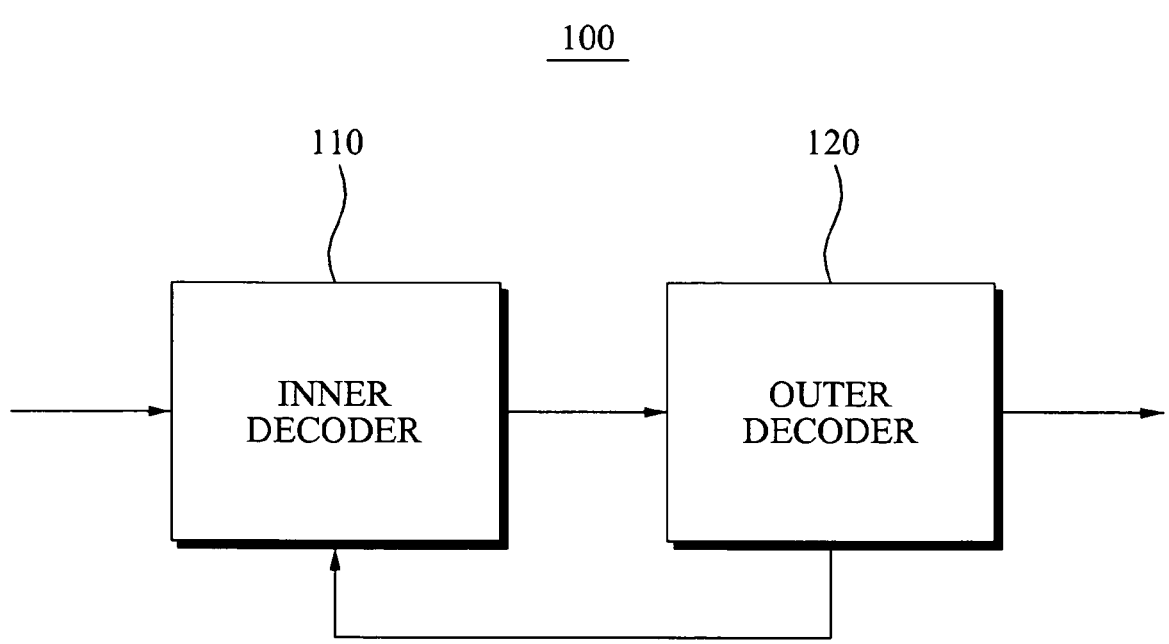
FIG. 1 is a diagram illustrating a concatenated decoder according to an example embodiment of the present invention.

Reference will now be made in detail to example embodiments of the present invention, examples of which are illustrated in the accompanying drawings, wherein like reference numerals refer to the like elements throughout.

FIG. 1 is a diagram illustrating a concatenated decoder 100 according to an example embodiment of the present invention.

Referring to FIG. 1, the concatenated decoder 100 includes an inner decoder 110 and an outer decoder 120.

The inner decoder 110 receives an input bit stream and inner-decodes the received input bit stream to generate a first bit stream.

The outer decoder 120 generates error information about the received first bit stream, according to the generated error information, transmits an iterative decoding continuation request to the inner decoder 110 or outer-decodes the first bit stream to generate a second bit stream. When the error information satisfies a first condition, the outer decoder 120 transmits the iterative decoding continuation request to the inner decoder 110. When the error information satisfies a second condition, the outer decoder 120 outer-decodes the first bit stream and generates the second bit stream.

When receiving the iterative decoding continuation request, the inner decoder 110 iteratively inner-decodes the generated first bit stream to generate an updated first bit stream.

When receiving the iterative decoding continuation request with respect to the first bit stream, the inner decoder 110 increases a value stored in a register by 1. The value stored in the register indicates a number of times the iterative decoding continuation request with respect to the first bit stream is received.

The inner decoder 110 compares the number of times the iterative decoding continuation request with respect to the first bit stream is received and a maximum iteration number, and determines whether to iteratively inner-decode the first bit stream to generate the updated first bit stream according to a result of the comparing.

When the number of times the iterative decoding continuation request with respect to the first bit stream is received is not greater than the maximum iteration number, the inner decoder 110 iteratively inner-decodes the first bit stream to generate the updated first bit stream.

The maximum iteration number is determined based on an error correcting capability of the inner decoder 110 or an error correcting capability of the outer decoder 120.

When the inner decoder 110 generates the updated first bit stream and the updated first bit stream is transmitted to the outer decoder 120, the outer decoder 120 generates the error information about the received first bit stream.

When the error information satisfies the first condition, the outer decoder 120 transmits the iterative decoding continuation request to the inner decoder 110. When the error information satisfies the second condition, the outer decoder 120 outer-decodes the first bit stream to generate the second bit stream.

A maximum error correcting capability refers to a number of errors which may be maximally corrected by the outer decoder 120 in the first bit stream or in the updated first bit stream. The first condition refers to a condition that a number of errors ascertained from the error information in the first bit stream or the updated first bit stream is greater than the maximum error correcting capability. The second condition refers to a condition that the number of errors is not greater than the maximum error correcting capability.

The maximum error correcting capability is determined based on the error correcting capability of the outer decoder 120.

The outer decoder 120 transmits the iterative decoding continuation request to the inner decoder 110, until the number of errors in the first bit stream generated by the inner decoder 110 is not greater than the maximum error correcting capability of the outer decoder 120.

The inner decoder 110 iteratively inner-decodes the first bit stream and updates, until the number of errors in the first bit stream is not greater than the maximum error correcting capability.

When the inner decoder 110 reduces the number of errors in the first bit stream to be not greater than the maximum error correcting capability, the outer decoder 120 may outer-decode the first bit stream to generate the second bit stream. The second bit stream is error-free.

When the inner decoder 110 may update the first bit stream without being limited in a number of inner-decoding iterations, the number of errors in the first bit stream may be equal to or less than the maximum error correcting capability of the outer decoder 120. However, due to time constraint, the maximum iteration number of the inner decoder 110 is set in advance and a number of iteration of the inner decoder 110 is limited.

Depending on embodiments of the present invention, the inner decoder 110 may inner-decode the first bit stream and update, until the iterative decoding continuation request is received up to the maximum iteration number from the outer decoder 120.

When the number of times the iterative decoding continuation request is received from the outer decoder 120 is greater than the maximum iteration number, the inner decoder 110 does not update the first bit stream and transmits a decoding denial message to the outer decoder 120.

When receiving the decoding denial message from the inner decoder 110, the outer decoder 120 outputs an error correction failure message.

The error correction failure message may be a predetermined bit stream having a same length as the second bit stream.

The outer decoder 120 transmits a decoding completion message to the inner decoder 110 after generating and outputting the second bit stream.

When receiving the decoding completion message, the inner decoder 110 receives a subsequent input bit stream, and inner-decodes the subsequent input bit stream.

In this instance, the inner decoder 110 resets a register storing the number of times the iterative decoding continuation request is received. A number of iteration begins counting from zero with respect to a new input bit stream.

Depending on embodiments of the present invention, the outer decoder 120 may transmit the iterative decoding continuation request to the inner decoder 110 based on the error information about the first bit stream and a number of the iterative decoding continuation request is transmitted, or outer-decode the first bit stream to generate the second bit stream.

When the number of errors ascertained from the error information about the first bit stream is not greater than the maximum error correcting capability, the outer decoder 120 outer-decodes the first bit stream to generate the second bit stream.

When the number of errors is greater than the maximum error correcting capability and the number of the iterative decoding continuation request is transmitted is not greater than the maximum iteration number, the outer decoder 120 retransmits the iterative decoding continuation request to the inner decoder 110.

When the number of errors is greater than the maximum error correcting capability and the number of the iterative decoding continuation request is transmitted is greater than the maximum iteration number, the outer decoder 120 outputs an error correction failure message.

Depending on embodiments of the present invention, the error information may include at least one of a number of errors in the first bit stream, an error location in the first bit stream, an error value, and an error correctability of the first bit stream.

Depending on embodiments of the present invention, the inner decoder 110 may inner-decode the input bit stream using a block code decoding scheme.

Depending on embodiments of the present invention, the inner decoder 110 may inner-decode the input bit stream using a convolutional code decoding scheme such as Viterbi decoding.

The outer decoder 120 outer-decodes the first bit stream using a decoding scheme where the maximum error correcting capability is exposed.

A code which exposes the maximum error correcting capability includes cyclic codes, and the like. The cyclic codes include a Bose, Ray-Chaudhuri, Hocquenghem (BCH) code, Reed-Solomon code, and the like. A decoding scheme of above-described codes includes a Meggitt, Berlekamp-Massey, Euclid decoding scheme, and the like.

Hereinafter, a performance of the concatenated decoder 100 is described in greater detail.

It is assumed that a number of errors included in the first bit stream changes as follows, when the inner decoder 110 iterates an inner-decoding without a feedback of the outer decoder 120.

a number of errors occurring from a channel—40
a number of errors after a first inner-decoding—30
a number of errors after a second inner-decoding—8
a number of errors after a third inner-decoding—12
a number of errors after a fourth inner-decoding—20
a number of errors after a fifth inner-decoding—10

It is assumed that, when the number of errors included in the first bit stream is not greater than 10, the outer decoder 120 may outer-decode the first bit stream and generate the second bit stream which is error-free. That is, it is assumed that a maximum error correcting capability of the outer decoder 120 is 10.

When iteratively inner-decoding without the feedback of the outer decoder 120, the inner decoder 110 iterates the inner-decoding as many as a predetermined number of iterations, for example, 5.

According to the present exemplary embodiment of the present invention, the number of errors included in the first bit stream is 8 after the second inner-decoding. Accordingly, the outer decoder 120 does not transmit the iterative decoding continuation request and outer-decodes the first bit stream to generate the second bit stream which is error-free.

The concatenated decoder 100 according to present exemplary embodiment of the present invention may reduce a number of iteration of the inner decoder 110 through the feedback of the outer decoder 120.

The concatenated decoder 100 may reduce a computational requirement of the inner decoder 110 by feeding back the error information about the first bit stream or updated first bit stream to the inner decoder 110 from the outer decoder 120. Generally, the inner decoder 110 is embodied using a circuit, and a number of times that a computation, such as a multiplication and addition, of circuit is iterated affects a power consumption of circuit.

The concatenated decoder 100 may reduce a power consumption of the concatenated decoder 100 by reducing the computational requirement of the inner decoder 110.

Depending on embodiments of the present invention, it is assumed that, when the number of errors included in the first bit stream is not greater than 8, the outer decoder 120 may outer-decode the first bit stream to generate the second bit stream which is error-free. That is, it is assumed that a maximum error correcting capability of the outer decoder 120 is 8.

When the inner decoder 110 is set to iterate the inner-decoding five times without the feedback of the outer decoder 120, the first bit stream includes ten errors after inner-decoding the five times. Accordingly, the outer decoder 120 may not generate the error-free second bit stream even when the first bit stream may be outer-decoded if it is forwarded to the outer decoder after the second inner decoding.

Conversely, in the concatenated decoder 100, since the number of errors included in the first bit stream is 8 after the second inner-decoding, the inner decoder 110 no longer iterates the inner decoding. Also, the outer decoder 120 outer-decodes the first bit stream and may generate the error-free second bit stream.

Accordingly, the concatenated decoder 100 may have a high possibility of generating the error-free second bit stream.

Figure 2:
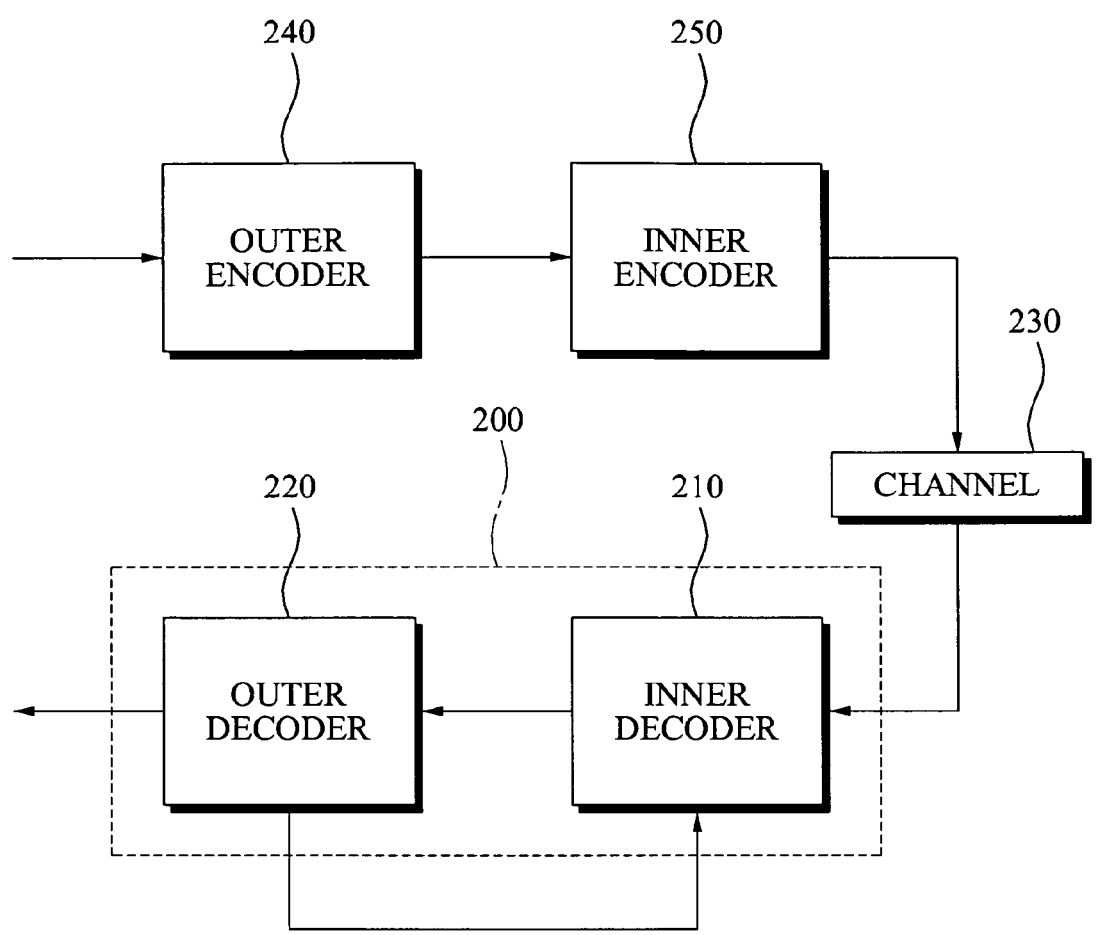
FIG. 2 is a diagram illustrating an encoding and decoding operation performed in a concatenated encoding and decoding system including a concatenated decoder according to an example embodiment of the present invention.

FIG. 2 is a diagram illustrating an encoding and decoding operation performed in a concatenated encoding and decoding system including a concatenated decoder 200 according to an example embodiment of the present invention.

Referring to FIG. 2, the concatenated decoder 200 includes an inner decoder 210 and an outer decoder 220.

An outer encoder 240 receives an input bit stream, and outer-encodes the received input bit stream to generate a first bit stream. An inner encoder 250 inner-encodes the first bit stream to generate a second bit stream.

The second bit stream is inputted to a channel 230. The second bit stream is transformed to a third bit stream. The third bit stream passes the channel 230 and includes an error. The third bit stream is transmitted to the inner decoder 210.

The inner decoder 210 receives the third bit stream and inner-decodes the received third bit stream to generate a fourth bit stream.

The outer decoder 220 generates error information about the fourth bit stream. The outer decoder 220 determines a number of errors in the fourth bit stream based on the error information. When the number of errors is not greater than a maximum error correcting capability of the outer decoder, the outer decoder 220 outer-decodes the fourth bit stream to generate a fifth bit stream.

When the number of errors is greater than the maximum error correcting capability, the outer decoder 220 transmits an iterative decoding continuation request to the inner decoder 210.

The channel 230 may be a transmission line or air. Also, the channel 230 may be a data writing path or a data reading path of a data storage device. The channel 230 may be a time passage from when data is stored in the data storage device to when stored data is read.

When the channel 230 is the transmission line, the concatenated encoding and decoding system is a wired communication system. When the channel 230 is the air, the concatenated encoding and decoding system is a wireless communication system.

When the channel 230 is an optical cable, the concatenated encoding and decoding system is an optical communication system.

When the channel 230 is the data writing path or data reading path of the data storage device, the data storage device may be an optical storage device.

Also, the data storage device may be a magnetic recording device and semiconductor memory.

The semiconductor memory may include a Dynamic Random Access Memory (DRAM), Static Random Access Memory (SRAM), NAND Flash memory, NOR Flash memory, CTF (Charge Trap Flash) memory, Phase-change Random Access Memory (PRAM), Magnetic Random Access Memory (MRAM), Ferroelectric Random Access Memory (FeRAM), and the like.

The third bit stream may be different from the second bit stream according to a feature of the channel 230. In this instance, a difference between the third bit stream and the second bit stream is an error of the third bit stream.

The concatenated decoder 200 aims at generating a fifth bit stream which is the same as the input bit stream. A difference between the fifth bit stream and the input bit stream is an error of the fifth bit stream generated by the outer decoder 220.

According to a result of simulation, due to the feature of the channel 230, when many errors of the third bit stream do not exist, a decoding performance acquired by the concatenated decoder 200 may be improved.

The concatenated decoder 200 may have a high possibility of generating an error-free fifth bit stream using a feedback of the outer decoder 220.

Figure 3:
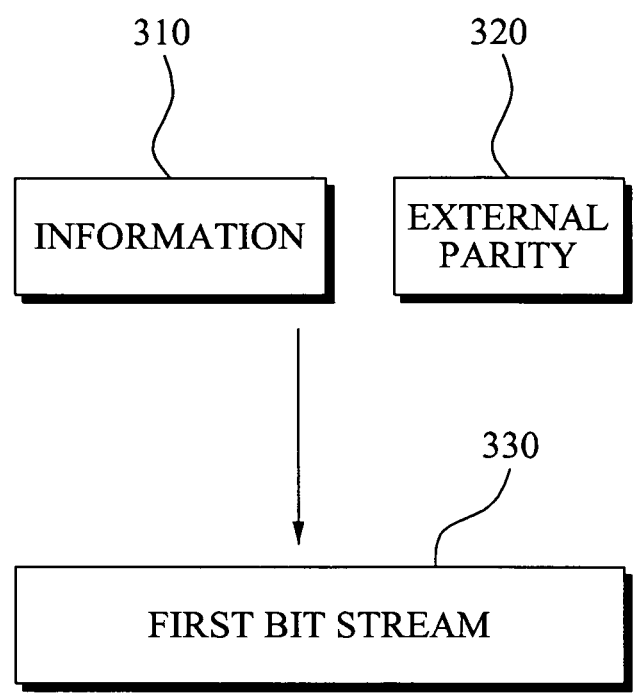
FIG. 3 is a diagram illustrating an outer-encoding operation performed by an outer encoder of FIG. 2.

FIG. 3 is a diagram illustrating an outer-encoding operation performed by the outer encoder 240 of FIG. 2.

Referring to FIG. 3, the outer encoder 240 generates a first bit stream 330 based on information 310, included in an input bit stream, and an external parity 320. The external parity 320 may be determined according to an outer-encoding scheme. The outer encoder 240 outer-encodes the information 310 and the external parity 320 to generate the first bit stream 330.

An outer decoder 220 performs an outer-encoding of an outer encoder 240 in reverse. The outer decoder 220 outer-decodes a fourth bit stream to generate a fifth bit stream.

The outer decoder 220 separates information and the external parity 320 from the fourth bit stream. When the information separated by the outer decoder 220 is the same as the information 310, the fifth bit stream does not include an error.

Figure 4:
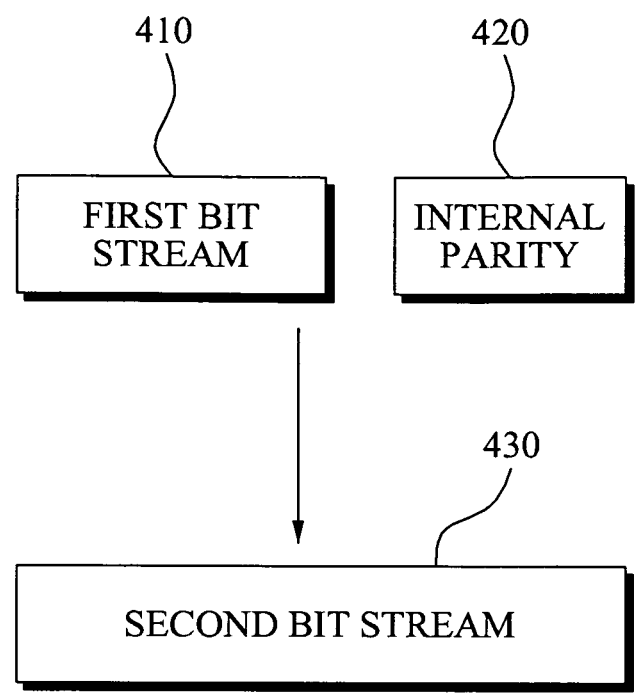
FIG. 4 is a diagram illustrating an inner-encoding operation performed by an inner encoder of FIG. 2.

FIG. 4 is a diagram illustrating an inner-encoding operation performed by the inner encoder 250 of FIG. 2.

Referring to FIG. 4, the inner encoder 250 generates a second bit stream 430 based on a first bit stream 410 and an internal parity 420. The internal parity 420 may be determined according to an inner-encoding scheme. The inner encoder 250 inner-encodes the first bit stream 410 and the internal parity 420 to generate the second bit stream 430.

An inner decoder 210 performs an inner-encoding of the inner encoder 250 in reverse. The inner decoder 210 inner-decodes a third bit stream to generate a fourth bit stream.

The inner decoder 210 separates the fourth bit stream and the internal parity 420 from the third bit stream.

Depending on embodiments of the present invention, the inner decoder 210 and the inner encoder 250 may perform an inner-decoding and inner-encoding using a low-density parity-check (LDPC) code encoding/decoding scheme.

Depending on embodiments of the present invention, the inner decoder 210 and the inner encoder 250 may perform an inner-decoding and inner-encoding using a convolutional code encoding/decoding scheme.

Depending on embodiments of the present invention, the inner decoder 210 and the inner encoder 250 may perform an inner-decoding and inner-encoding using a turbo code encoding/decoding scheme.

Depending on embodiments of the present invention, the inner decoder 210 and the inner encoder 250 may perform an inner-decoding and inner-encoding using a Coded Modulation encoding/decoding scheme such as TCM (Trellis Coded Modulation) and BCM (Block Coded Modulation).

Figure 5:
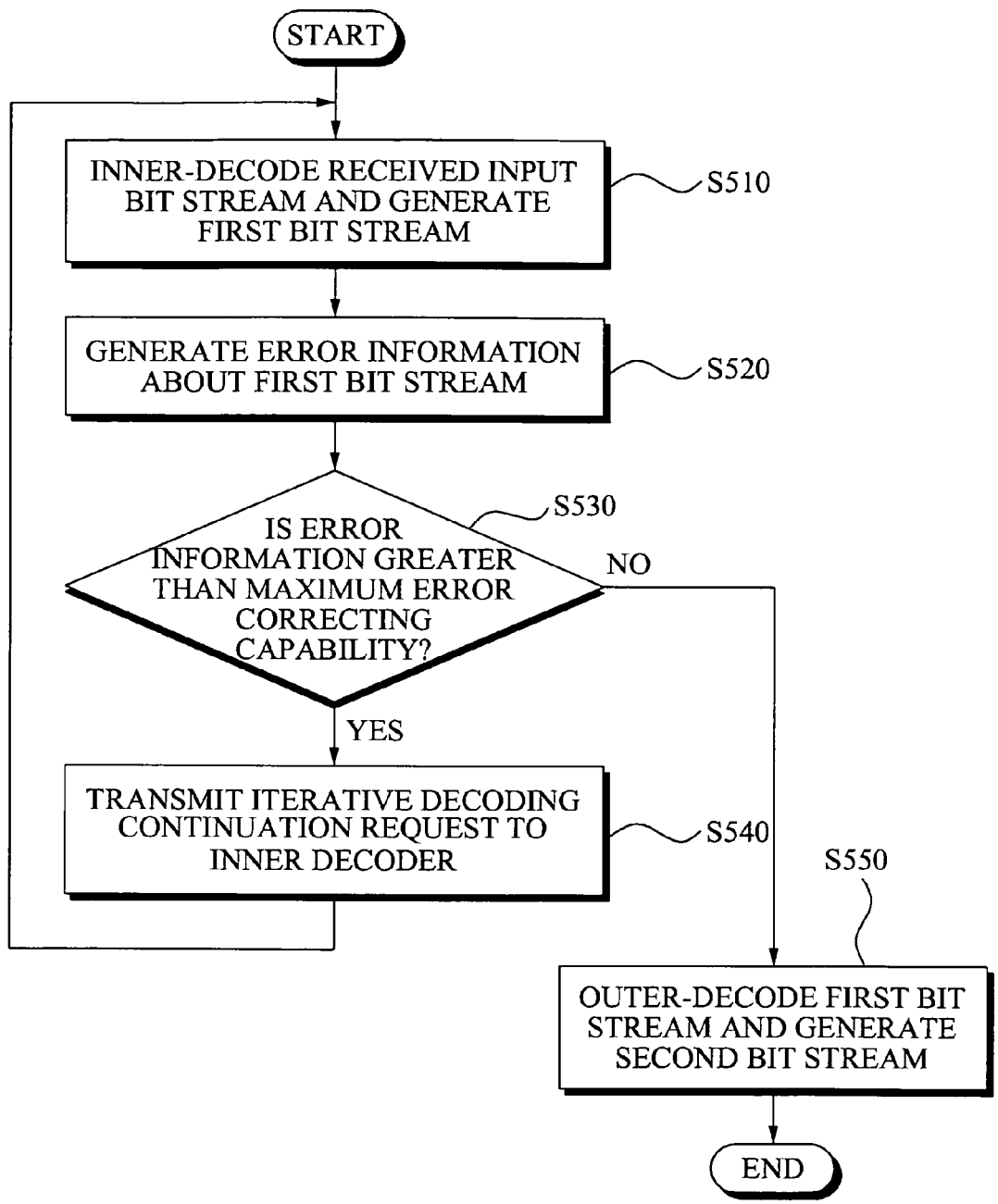
FIG. 5 is a flowchart illustrating a concatenated decoding method according to an example embodiment of the present invention.

FIG. 5 is a flowchart illustrating a concatenated decoding method according to an example embodiment of the present invention.

Referring to FIG. 5, in operation S510, the concatenated decoding method inner-decodes a received input bit stream to generate a first bit stream.

In operation S520, the concatenated decoding method generates error information about the generated first bit stream in an outer decoder.

In operation S530, the concatenated decoding method determines whether the error information is greater than a maximum error correcting capability of the outer decoder.

In operation S540, the concatenated decoding method transmits an iterative decoding continuation request to an inner decoder, when the error information is greater than the maximum error correcting capability in operation S530.

The concatenated decoding method performs the inner-decoding and generating in operation S510 again after transmitting in operation S540.

In operation S550, the concatenated decoding method outer-decodes the first bit stream to generate a second bit stream, when the generated error information is not greater than the maximum error correcting capability.

Depending on embodiments of the present invention, when receiving an iterative decoding continuation request is received, the concatenated decoding method may iteratively inner-decode the generated first bit stream to generate an updated first bit stream in operation S510.

Depending on embodiments of the present invention, in operation S510, the concatenated decoding method may determine whether to iteratively inner-decode the generated first bit stream based on a number of times that the iterative decoding continuation request is received.

Depending on embodiments of the present invention, when a number of times that an outer decoder transmits the iterative decoding continuation request is not greater than a maximum iteration number, the concatenated decoding method may transmit the iterative decoding continuation request to an inner decoder in operation S540.

Depending on embodiments of the present invention, the error information may include at least one of a number of errors in the first bit stream, an error location in the first bit stream, and an error correctability of the first bit stream.

Depending on embodiments of the present invention, in operation S550, the first bit stream may be outer-decoded according to a decoding scheme of cyclic codes.

Figure 6:
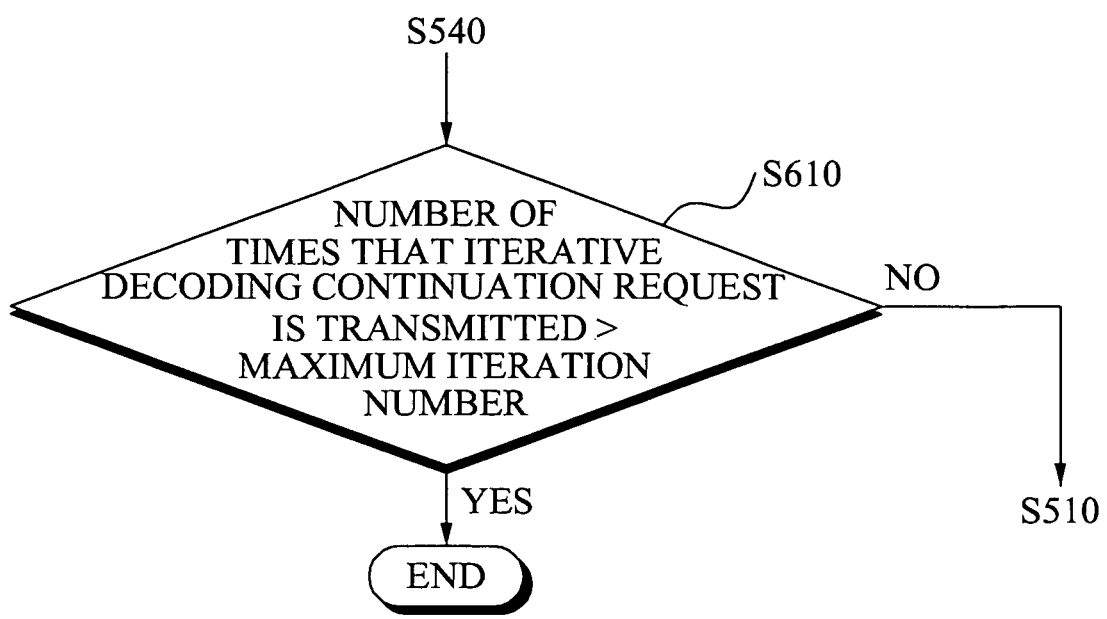
FIG. 6 is a flowchart illustrating a concatenated decoding method according to another example embodiment of the present invention.

FIG. 6 is a flowchart illustrating a concatenated decoding method according to another example embodiment of the present invention.

Referring to FIG. 6, after transmitting in operation S540, in operation S610, the concatenated decoding method determines whether a number of times that the iterative decoding continuation request is transmitted is greater than the maximum iteration number.

When the number of times that the iterative decoding continuation request is transmitted is greater than the maximum iteration number, the concatenated decoding method ends.

When number of times that the iterative decoding continuation request is transmitted is not greater than the maximum iteration number, the concatenated decoding method returns to operation S510.

The above-described example embodiments of the present invention may be recorded in a computer-readable media including program instructions to implement various operations embodied by a computer. The media may also include, alone or in combination with the program instructions, data files, data structures, and the like. The media and program instructions may be those specially designed and constructed for the purposes the example embodiment of the present invention, or they may be of the kind well-known and available to those having skill in the computer software arts. Examples of computer-readable media include magnetic media such as hard disks, floppy disks, and magnetic tape, optical media, for example, CD ROM disks and DVD, magneto-optical media, for example, optical disks, and hardware devices that may be specially configured to store and perform program instructions, for example, read-only memory (ROM), random access memory (RAM), flash memory, and the like. The media may also be a transmission medium such as optical or metallic lines, wave guides, etc. including a carrier wave transmitting signals specifying the program instructions, data structures, etc. Examples of program instructions include both machine code, for example, produced by a compiler, and files containing higher level code that may be executed by the computer using an interpreter. The described hardware devices may be configured to act as one or more software modules in order to perform the operations of the above-described example embodiments of the present invention.

Although a few exemplary embodiments of the present invention have been shown and described, the present invention is not limited to the described exemplary embodiments. Instead, it would be appreciated by those skilled in the art that changes may be made to these exemplary embodiments without departing from the principles and spirit of the invention, the scope of which is defined by the claims and their equivalents.

What is claimed is:

1. A concatenated decoder, comprising:
   an inner decoder to receive an input bit stream, and inner-decode the received input bit stream to generate a first bit stream; and
   an outer decoder configured to generate error information about the received first bit stream, and according to the error information generated by the outer decoder, transmit an iterative decoding continuation request to the inner decoder or outer-decode the first bit stream to generate a second bit stream,
   wherein if the error information generated by the outer decoder indicates a number of errors is below a threshold, the outer decoder does not transmit the iterative decoding continuation request, and outer-decodes the first bit stream to generate the second bit stream.

2. The concatenated decoder of claim 1, wherein the inner decoder iteratively inner-decodes the generated first bit stream to generate an updated first bit stream, when the iterative decoding continuation request is received.

3. The concatenated decoder of claim 2, wherein the inner decoder determines whether to iteratively inner-decode the generated first bit stream based on a number of times that the iterative decoding continuation request is received.

4. The concatenated decoder of claim 1, wherein the outer decoder determines whether to transmit the iterative decoding continuation request to the inner decoder or to outer-decode the first bit stream based on a number of times that the iterative decoding continuation request is transmitted.

5. The concatenated decoder of claim 1, wherein the outer decoder does not transmit the iterative decoding continuation request, and outer-decodes the first bit stream to generate the second bit stream when the generated error information is not greater than a maximum error correcting capability, the second bit stream being error-free.

6. The concatenated decoder of claim 1, wherein the error information includes at least one of a number of errors in the first bit stream, an error location in the first bit stream, and an error correctability of the first bit stream.

7. The concatenated decoder of claim 1, wherein the outer decoder outer-decodes the first bit stream according to a decoding scheme of cyclic codes.

8. A concatenated decoding method, comprising:
   inner-decoding a received input bit stream to generate a first bit stream;
   generating error information about the generated first bit stream;
   transmitting an iterative decoding continuation request to an inner decoder, when the generated error information is greater than a maximum error correcting capability of an outer decoder; and
   outer-decoding the first bit stream to generate a second bit stream, when the generated error information is not greater than the maximum error correcting capability of the outer decoder and the generated error information indicates a number of errors is below a threshold.

9. The concatenated decoding method of claim 8, wherein the inner-decoding iteratively inner-decodes the generated first bit stream to generate an updated first bit stream, when the iterative decoding continuation request is received.

10. The concatenated decoding method of claim 9, wherein the inner-decoding determines whether to iteratively inner-decode the generated first bit stream based on a number of times that the iterative decoding continuation request is received.

11. The concatenated decoding method of claim 8, wherein the transmitting transmits the iterative decoding continuation request to the inner decoder, when a number of times that the iterative decoding continuation request is transmitted is not greater than a maximum iteration number and the generated error information is greater than the maximum error correcting capability.

12. The concatenated decoding method of claim 8, wherein the error information includes at least one of a number of errors in the first bit stream, an error location in the first bit stream, and an error correctability of the first bit stream.

13. The concatenated decoding method of claim 8, wherein the outer-decoding outer-decodes the first bit stream according to a decoding scheme of cyclic codes.

14. At least one non-transitory medium comprising computer readable instructions implementing a concatenated decoding method, comprising:
   inner-decoding a received input bit stream to generate a first bit stream;
   generating error information about the generated first bit stream;
   transmitting an iterative decoding continuation request to an inner decoder, when the generated error information is greater than a maximum error correcting capability of an outer decoder; and
   outer-decoding the first bit stream to generate a second bit stream, when the generated error information is not greater than the maximum error correcting capability of the outer decoder and the generated error information indicates a number of errors is below a threshold.

* * * * *